United States Patent [19]
Ezzedine et al.

[11] Patent Number: 6,137,367
[45] Date of Patent: Oct. 24, 2000

[54] HIGH POWER HIGH IMPEDANCE MICROWAVE DEVICES FOR POWER APPLICATIONS

[75] Inventors: Amin Ezzedine, Germantown; Ho C. Huang, Potomac, both of Md.

[73] Assignee: AMCOM Communications, Inc., Clarksburg, Md.

[21] Appl. No.: 09/263,853

[22] Filed: Mar. 8, 1999

Related U.S. Application Data

[60] Provisional application No. 60/079,148, Mar. 24, 1998.

[51] Int. Cl.[7] .................................................. H03F 3/04

[52] U.S. Cl. .............................................. 330/311; 330/98

[58] Field of Search ................................ 330/98, 99, 100, 330/302, 310, 311

[56] References Cited

U.S. PATENT DOCUMENTS

| | | | |
|---|---|---|---|
| 2,864,902 | 12/1958 | Overbeek | 179/171 |
| 2,999,984 | 9/1961 | Beck | 330/18 |
| 3,890,576 | 6/1975 | Kobayashi | 330/18 |
| 4,199,732 | 4/1980 | Dkuma | 330/267 |
| 4,312,060 | 1/1982 | Grodinsky | 369/134 |
| 4,319,198 | 3/1982 | Sosin | 330/296 |
| 5,945,879 | 8/1999 | Rodwell et al. | 330/310 |

OTHER PUBLICATIONS

Ezzedine et al, "High–Voltage FET Amplifiers for Satellite and Phased–Array Applications", IEEE MTT–S Int. Microwave Sym. Digest, pp. 336–339 (1985).

*Primary Examiner*—Benny Lee
*Assistant Examiner*—Henry Choe
*Attorney, Agent, or Firm*—Michael de Angeli

[57] ABSTRACT

Simplified, efficient multiple-transistor power amplifiers provide high power and high impedance while avoiding the use of RF power divider and combiner circuits.

The input signal is directly applied to a first transistor, amplified, and supplied to the succeeding transistor, and so on, for amplification in series. Feedback is provided between the drain of the last transistor and the gates of all the transistors. Series connection of the transistors allows their power outputs and their output impedances to be summed, such that no RF output combiner is required.

In a first high voltage embodiment of the amplifier of the invention, e.g., as used for satellite transmission, bias voltage is provided in series.

In a second low voltage embodiment, suitable for use in cordless telephones and other battery-powered equipment, bias voltage $V_{ds}$ is provided separately across the drain and source terminals of each transistor, through paired chokes.

26 Claims, 3 Drawing Sheets

HIGH POWER HIGH IMPEDANCE MICROWAVE DEVICES FOR POWER APPLICATIONS

CROSS-REFERENCE TO RELATED APPLICATION

This application claims priority from Provisional Patent Application Ser. No. 60/079,148, filed Mar. 24, 1998.

FIELD OF THE INVENTION

This invention relates to high power microwave devices for amplifier applications, more particularly, to high-power solid state amplifiers. The invention is particularly useful where there are constraints on the device output impedance, as in satellite transmitters, and/or on the voltage available, as in battery-powered cordless telephones and the like.

BACKGROUND OF THE INVENTION

The present invention addresses two fundamental problems limiting the utility of present-day microwave semiconductor devices: low operating voltage and low input and output impedance.

Essentially most microwave solid state amplifiers employ power Gallium Arsenide (GaAs) semiconductor devices as amplifying elements. The low breakdown voltage of these semiconductor devices limits their maximum operating voltage, usually to less than 10 V.

Moreover, in many amplifier designs, it is desirable to achieve relatively high output power over a wide bandwidth. However, because microwave power devices have an impedance of only a few ohms, which is small compared to the 50 Ohms (50 Ω) impedance in conventional systems, it is very difficult to match these devices to the 50 Ω system impedance over a wide bandwidth without substantial degradation in performance. Furthermore, where the device in question is battery-powered, such as a cordless telephone or the like, limitations imposed by current battery technology typically limit the available voltage to 3 V. As the devices also have limited current-carrying ability, these voltage limitations effectively limit the output power available.

In order to obtain efficient transfer of power from a microwave device to an associated output load, the output impedance of the device must be matched to the impedance of the load. This is particularly a challenging problem in microwave links and satellite transmission systems, where the output impedance of the device must be matched to the transmission line impedance, which is usually 50 Ω. Note that the output impedance of a typical power GaAs MESFET device, providing 3 watts output power, is around 5 Ω. This mismatch requires costly and inefficient impedance matching networks, and limits the device to narrow band performance. The combination of low operating voltage and low output impedance has limited the effective output power of these devices. The same is true to a greater or lesser degree in amplifiers using other types of semiconductors, such as Gallium Arsenide (GaAs) or Indium Phosphide (InP) HEMT, PHEMT and HBT devices, as well as silicon bipolar or MOSFET devices.

The prior art has attempted to overcome the inherent power limitation of individual power semiconductor elements by providing multiple devices connected in parallel, resulting in extremely small impedance levels. However, matching circuits using traditional parallel power combining circuits are complex, lossy, and do not provide an efficient solution to the impedance mismatch problem noted above.

More specifically, FIG. 1 shows a conventional high voltage, multiple-element FET amplifier circuit, for microwave communication and satellite transmitters. The circuit shown is described in detail in Ezzeddine et al, "High-Voltage FET Amplifiers for Satellite and Phased-Array Applications", *IEEE MTT-S Int. Microwave Sym. Digest*, pp. 336–9 (1985). In this circuit, the input signal to be amplified is supplied at terminal 10, as indicated by the legend "RF in". The input signal is divided by a power divider network 12, and supplied to four identical input matching networks 14. The input signal is then fed to the gate terminals G of four identical field-effect transistors (FETs) 16. The output signals from all four FETs are combined by a power combiner 22. This circuit, where the DC supply voltage is provided in series configuration, and the RF signal is combined in parallel configuration, requires both an input power divider and an output power combiner; these components not only increase the size and weight of the amplifier but also degrade the amplifier performance because of the loss in the power divider and combiner circuits.

In a typical satellite transmitter a 24–40V bus is available for the DC bias voltage $V_{dd}$, that is, to provide a supply voltage to the transistor devices 16 to provide power amplification. However due to the low transistor breakdown voltage, the bias voltage is limited by to a maximum between 6 and 10 V; that is, the voltage $V_{ds}$ across the drain terminal D and the source terminal S cannot exceed this value. Therefore, the input voltage $V_{dd}$ is divided by a string of four series-connected resistors 18 so that each transistor 16 "sees" only 6–10 V (i.e., $V_{dd}/4$) as $V_{ds}$ across its drain and source terminals; the values indicated on FIG. 1 next to the drain terminals of each transistor (e.g., 3 $V_{ds}$) are referenced to ground. It will be appreciated by those of skill in the art that in this circuit configuration, the input voltage $V_{dd}$, having been divided by resistors 18 to a value suitable as DC bias voltage $V_{ds}$, is effectively provided in series across the four transistors 16.

As noted, the input RF signal is divided by power divider 12 and supplied, by way of input matching networks 14, to each of four transistors 16 for separate amplification. The amplified RF signal provided by each transistor 16 is supplied to an output matching network 20, and their output signals are combined in a power combiner 22, becoming the "RF out" signal at terminal 24. The input RF signal is thus divided and amplified in parallel; the amplified signals are recombined by the power combiner 22, forming the RF out signal.

It will be appreciated that a choke 26 is provided between the terminal 30 to which $V_{dd}$ is applied and the drain terminal of the first transistor 16; the choke 26 allows the DC bias current to flow, while blocking flow of the RF input signal. Correspondingly, capacitors 28 are provided between the points at which adjacent pairs of transistors are connected and ground, grounding any RF energy that might otherwise flow between adjacent transistors 16, but preventing flow of the bias current to ground. The effect of capacitors 28 is therefore to provide RF isolation of the four transistors 16 from one another, so that the divided input signal is separately amplified by each of the transistors, that is, is amplified in parallel.

The prior art circuit of FIG. 1 can thus be characterized as providing series connection of the DC bias voltage and parallel connection of the RF signal. As noted, while this circuit has been successful commercially, it includes complex and inefficient RF power dividing and combining components. Further, each of the parallel amplifying "cells" requires input and output matching networks; in essence, the function of the output matching networks 20 and the power combiner 22 is to match the low output impedances of the transistors 16, typically 5–10 Ω, to the desired impedance of an antenna or another output device, typically 50 Ω. As will be appreciated by those of skill in the art, such components are costly, inefficient and due to complexity result in good performance only over a narrow bandwidth.

OBJECTS AND SUMMARY OF THE INVENTION

It is therefore an object of the invention to provide circuitry for a microwave device which is suitable for providing high power into a high-impedance (e.g., 50 Ω) load that avoids the use of complex RF power dividing and combining circuitry, and that has broadband frequency capability.

It is a further object of the invention to provide a multiple-element amplifier circuit avoiding multiple input and output matching circuits.

Still a further object of the invention is to provide simplified, more efficient multiple-transistor power amplifiers avoiding the use of RF power divider and combiner circuits, and providing high power in devices powered by low-voltage sources such as batteries.

As noted above, in the prior art circuit of FIG. 1, the RF input signal is divided; the divided signals are amplified separately, and recombined. That is, the amplification is performed by each amplifying transistor in parallel. By comparison, according to the present invention, as illustrated in FIG. 2, the input signal is applied directly to a first transistor, without an RF power divider, amplified, and supplied to the succeeding transistor, and so on, for amplification in series. That is, the RF signal is passed from one transistor to the next, and amplified at each stage. Feedback is provided between the drain of the last transistor and the gates of all the transistors; this allows maximum voltage swing on the output of each transistor, and thus maximum power. The amplifier circuit itself thus becomes the power combining element. More particularly, the series connection of the transistors effectively sums their power outputs and their output impedances; the output impedance is sufficient for efficient power transfer to a high-impedance load. As compared to the requirement of input and output matching networks for each amplifier cell in the prior art circuit of FIG. 1, single input and output matching networks are required in the circuit of the invention, and the power dividing and combining elements of the prior art circuit are eliminated entirely by the circuit of the invention.

In a first high voltage embodiment of the amplifier of the invention, e.g., as used for satellite transmission, the drain of one transistor in the series is connected to the source of the next, and the points at which the adjacent transistors are connected are not connected to ground. Bias voltage is provided in series, as in the prior art circuit of FIG. 1. Thus, in this embodiment, the RF signal and the DC bias are both essentially connected in series. Feedback of the output signal is accomplished through the same string of series-connected resistors used to supply bias voltage to each transistor.

In a second low voltage embodiment, illustrated in FIG. 5, suitable for use in cordless telephones and other battery-powered equipment, the adjacent transistors are separated by capacitors, preventing flow of DC bias. Bias voltage $V_{ds}$ is provided separately across the drain and source terminals of each transistor, through paired chokes; the chokes allow DC to flow between the terminal at which $V_{ds}$ is provided and the drain of each transistor, and between the source terminal of each transistor and ground, while blocking loss of RF energy to ground. Hence, in this embodiment, RF energy flows in series from one transistor to the next, while the DC bias is provided in parallel, separately to each transistor.

In both embodiments, accordingly, the RF signal is amplified separately in each amplifier stage in series, and passed to the next, with feedback being provided to ensure full power operation; the distinction between high and low voltage operation refers to the manner in which DC bias for powering the amplification is provided to each of the amplifying transistors.

Further aspects and objects of the invention will become apparent to those of skill in the art as the discussion below proceeds.

BRIEF DESCRIPTION OF THE DRAWINGS

The invention will be better understood if reference is made to the accompanying drawings, in which.

DESCRIPTION OF THE PREFERRED EMBODIMENTS

Figure 2:
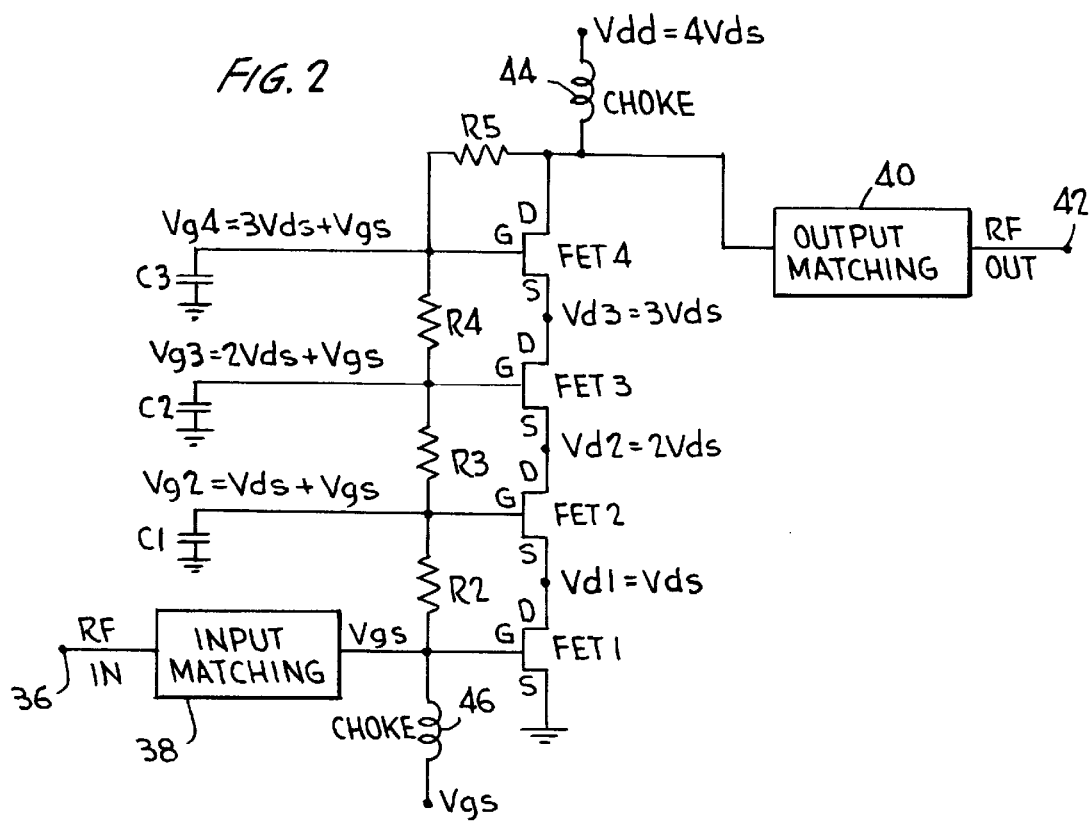
FIG. 2 shows a comparable diagram of a first high voltage embodiment of the amplifier of the invention.

As mentioned, FIG. 2 shows a block diagram of a first high-voltage high-power (HiVP) embodiment of the amplifier of the present invention. In the implementation shown, four essentially identical FETs FET1–FET4 are connected both DC and RF in series, with the drain terminal D of FET1 connected directly to the source terminal S of FET2, and so on. The input signal is connected to the amplifier at an input terminal 36, and passes through a single input matching network 38 to the gate terminal G of the first transistor FET1 in the series. The drain terminal D of FET4, the last transistor in the series, is connected through a single output matching network 40 to the output terminal 42 of the amplifier. The output signal from FET4 is also fed back via series-connected resistors R2–R5 to the gate terminals G of each of FETs 1–4. Capacitors C1–C3 adjust the impedance of each of the corresponding transistors FET2–FET4.

It will be appreciated that in the circuit of FIG. 2, amplification of the RF input signal takes place in series fashion; that is, the input signal is successively amplified in sequence by each of transistors FET1–FET4. Feedback provided between the drain of the last transistor FET4 in the series and the gates of all the transistors FET1–FET4 by way of the series-connected resistors R2–R5 ensures maximum voltage swing on the output of each transistor, and thus maximum power. The amplifier circuit itself thus becomes the power combining element. More particularly, the series connection of the transistors effectively sums their power outputs and their output impedances to a degree to allow efficient power transfer to a high-impedance load; no RF output combiner is required. As the input signal is applied only to the gate terminal G of the first transistor FET1 in the series, only a single input matching circuit 38 is required;

similarly, as the output is taken directly from the drain terminal of the last transistor FET4, only a single output matching circuit 40 is needed.

As mentioned above, FIG. 2 shows a so-called "high-voltage high-power (HiVP)" embodiment of the amplifier of the invention.

This embodiment is preferred where a relatively high supply voltage $V_{dd}$ of 24–40 V is available, as typically provided aboard satellites. (A low-voltage embodiment will be discussed later in connection with FIG. 5) As noted above, the bias voltage $V_{ds}$ across the drain and source terminals of typical amplifying elements, such as FETs FET1–FET4, is limited to 6–10 V. Accordingly, the supply voltage $V_{dd}$ is divided by series-connected resistors R2–R5, such that a suitable drain-to-source voltage $V_{ds}$ is "seen" by each transistor. It will be appreciated that, as in the case of the prior art circuit of FIG. 1, the points at which adjoining FETs are connected are not connected to ground, but "float" at voltage levels $V_{ds}$, $2V_{ds}$, and so on (measured with respect to ground), determined by the values of bias resistors R2–R5. That is, series-connected resistors R2–R5 serve as a voltage-dividing network, providing appropriate bias voltage to each of FETs 1–4.

The bias supply $V_{dd}$ and a point maintained at a fixed potential $V_{gs}$ are connected to the circuit through chokes, such that high-frequency input signal components are not dissipated. More particularly, the string of series-connected resistors R2–R5 are separated from $V_{dd}$ and $V_{gs}$ by chokes 44, 46, respectively; chokes 44, 46 prevent loss of RF energy. This allows the string of series-connected resistors R2–R5 also to carry the feedback signal; that is, in the absence of chokes 44, 46, the RF feedback signal would be dissipated by the $V_{dd}$ and $V_{gs}$ connections. As noted above, thus driving the FETs 1–4 by the output signal fed back as a control signal allows the four FETs 1–4 essentially to behave as a single amplifying element, with summed power and output impedance.

Figure 1:
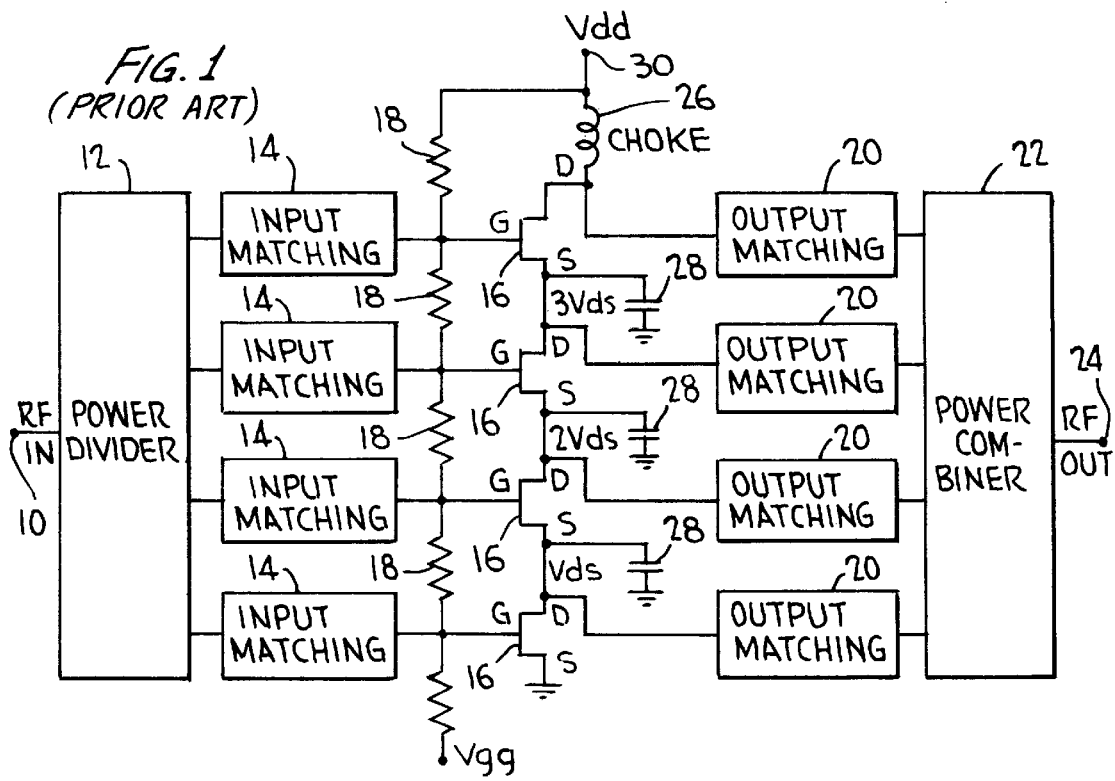
FIG. 1, as discussed above, shows a block diagram of the prior art amplifier circuit; the four FETs are DC in series and RF in parallel.

Having now described the operation of one embodiment of the circuit of the invention, it is possible to set forth its advantages with respect to the prior art circuit of FIG. 1. The high-voltage embodiment of the circuit of the invention as shown in FIG. 2 ("HiVP") has several advantages over the conventional parallel power combining circuit of FIG. 1, as follows:

1. High voltage, up to $V_{ds}$ * N, where $V_{ds}$ is the optimum cell drain-to-source bias voltage, and N is the number of cells, can be used to bias the device.
2. Lower current (by a factor of 1/N) is required for a circuit having identical transistors and providing the same output power.
3. Higher output impedance, by a factor N * N, is provided as compared to a prior art circuit with the same output power.
4. Higher power can be achieved compared to conventional designs.
5. Fewer, simpler, and lower cost input and output matching networks can be employed; power divider and combiner components are eliminated entirely.
6. The amplifier circuit of the invention can easily be implemented using various power transistor technologies, such as PHEMT, HBT or silicon devices, in addition to the MESFET technology discussed in detail.
7. Very High power levels could be achieved by applying the HiVP concept to silicon devices.
8. By adjusting the transistor size and the number of amplifier "cells" connected in series, essentially any desired combination of output power and bias voltage can be achieved.
9. Optimum output impedance close to 50 Ω can be achieved, resulting in simpler output matching circuit design and broadband performance.

Figure 3:
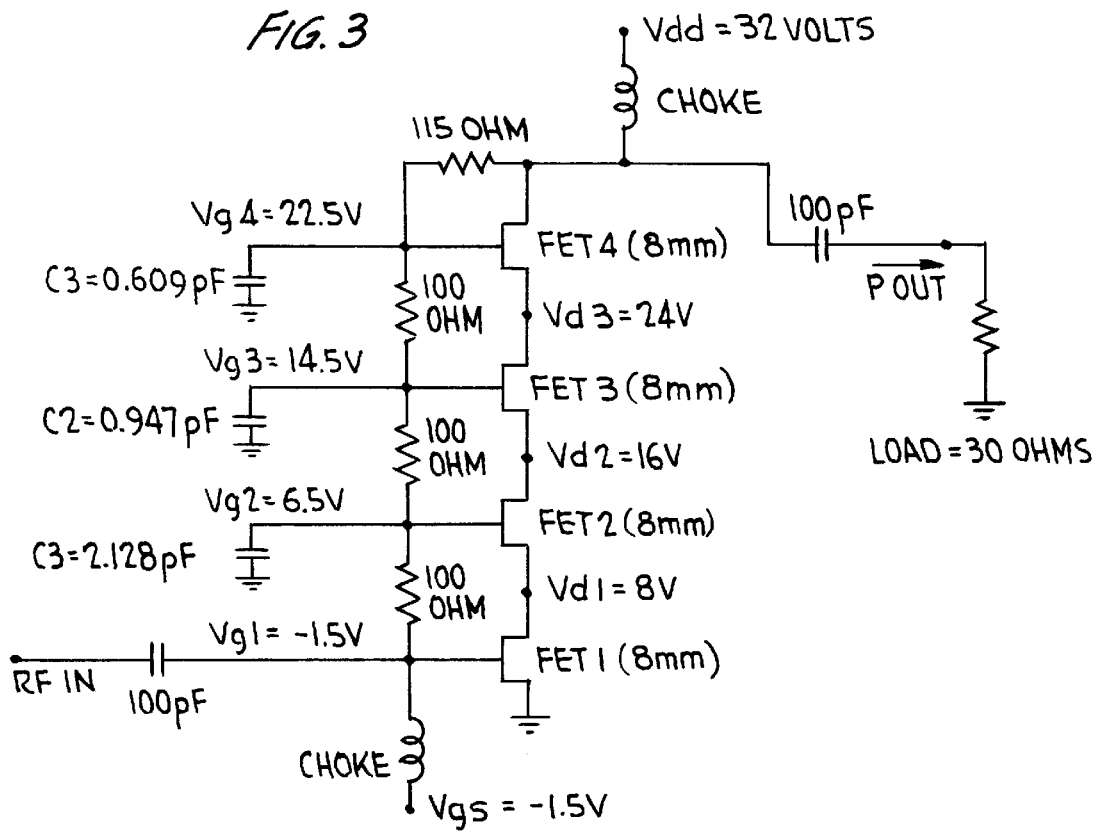
FIG. 3 shows a similar diagram, with specific component values listed.

Following is an example of the process of designing a HiVP circuit according to the invention, that is, in the high-voltage embodiment of FIG. 2, and a comparison of this design with a conventional design achieving the same power. FIG. 3 shows the component values thus determined.

Assume that the total FET periphery (a measure of the total heat-dissipating capacity of the circuit) available is W, that each cell bias voltage is $V_{ds}$, and that the saturation current is $I_{dss}$ per unit periphery. For an HiVP consisting of N cells in series with the same total device periphery W (i.e., unit cell periphery is W/N) the important design parameters are as follows:

1— Total drain bias $V_{dd}=N*V_{ds}$, where $V_{ds}$ is the desired FET drain-to-source bias
2— Individual drain voltages are: $V_{ds}$, $2V_{ds}$, $3V_{ds}$, . . . $NV_{ds}$
3— Individual gate voltages are: $V_{gs}$, $V_{gs}+V_{ds}$, $V_{gs}+2V_{ds}$, . . . $V_{gs}+(N-1)V_{ds}$
4— Total series current is: $0.5 I_{dss}*W/N$, where $I_{dss}$ is the saturation current per unit gate periphery
5— Maximum current swing is: $0.5 I_{dss}*W/N$
6— Maximum voltage swing is: $N*(V_{ds}-V_{knee})$, where $V_{knee}$ is the FET knee voltage. (Note that the breakdown voltage in each cell should be greater than $2V_{ds}-V_{knee}$)
7— Maximum power output: $P_{max}=0.25(V_{ds}-V_{knee})I_{dss}W$
8— Optimum load impedance: $Z_{opt}=2N^2(V_{ds}-V_{knee})/(I_{dss}W)$
9— Output impedance of each cell should be designed to have the following values: $Z_{opt}/N$, $2Z_{opt}/N$, . . . (N−1) $Z_{opt}/N$, $Z_{opt}$
10— Input impedance is that of a unit cell FET with width W/N As mentioned above, another important feature of the circuit of the invention is the provision of capacitors C1–C3, between the gates of the floating FETs and ground. These capacitors play an important role in adjusting the impedance level "seen" by the gates of each transistor FET1–FET4. This impedance adjustment is important in realizing the optimum power output from each cell.

More specifically, as above, $Z_{opt}$ is the optimum impedance needed at the drain terminal of each FET cell. Consequently, for the high-voltage embodiment of the invention shown in FIG. 2, the optimum impedance at the drain of FET1 should be $Z_{opt}$, at the drain of FET2 it should be $2Z_{opt}$, at the drain of FET3 it should be $3Z_{opt}$, and at the drain of FET4 it should be $4Z_{opt}$. Capacitors C1, C2 and C3 are instrumental in adjusting these impedance levels. The impedance at the source input of each FET is approximately equal to:

$$Z_{source}=1/g_m*(C_{gs}+C_{shunt})/C_{shunt}$$

where $Z_{source}$ is equal to the source input impedance of each FET $g_m$ is the FET cell transconductance
$C_{gs}$ is the gate to source FET cell capacitance
$C_{shunt}$ is the shunt capacitance between gate and ground
Capacitors C1–C3 form $C_{shunt}$ for the corresponding FETs, and their values should be chosen accordingly.

In summary, for the N-cell HiVP design according to the invention:

1— Bias Voltage is $N*V_{ds}$
2— Bias Current is $0.5WI_{dss}/N$
3— Maximum Class A output Power is $0.25(V_{ds}-V_{knee})WI_{dss}$
4— Optimum Drain Impedance is $2N^2(V_{ds}-V_{knee})/W/I_{dss}$ For a conventional design, according to FIG. 1, and employing similar FETs:

1— Bias Voltage is $V_{ds}$
2— Bias Current is $0.5\ W\ I_{dss}$
3— Maximum Class A power output is $0.25(V_{ds}-V_{knee})\ W\ I_{dss}$
4— Optimum Drain Impedance is $2\ (V_{ds}-V_{knee})/W/I_{dss}$ Thus, the optimum output impedance for the HiVP according to the invention is approximately $N^2$ larger than the impedance for a conventional design; it will be appreciated by those of skill in the art that this is a major achievement, particularly in that it permits great simplification of the output-matching requirement. Furthermore, the DC bias voltage is N times and the DC current is 1/N that of the conventional design, which reduces the $I^2R$ losses in the DC bias circuit.

FIG. 3 is an example of the HiVP circuit design according to the invention, providing actual values for the circuit components required. Note that the input and output matching networks simply comprise 100 pF capacitors. The relatively precise values of C1–C3 called for by FIG. 3 are achieved by conventional techniques, that is, by forming these components as sections of opposed conductive material on either side of the circuit board on which the amplifier is assembled. In this example, 4 GaAs FETs, each of 8 mm periphery, are employed for a total of 32 mm periphery. The bias parameters for each FET cell are:

$V_{ds}$=8.0 Volts $I_{ds}$=1.2 Amperes

The model used for each cell is that of a 0.7 $\mu$m GaAs FET device with a knee voltage equal to 1.5V, $I_{dds}$=0.3 A/mm and gate-to-drain breakdown voltage greater than 20V. Nonlinear analysis of this HiVP example indicates that the optimum impedance is close to 30 $\Omega$, which is close to the theoretical calculation for optimum impedance.

Figure 4:
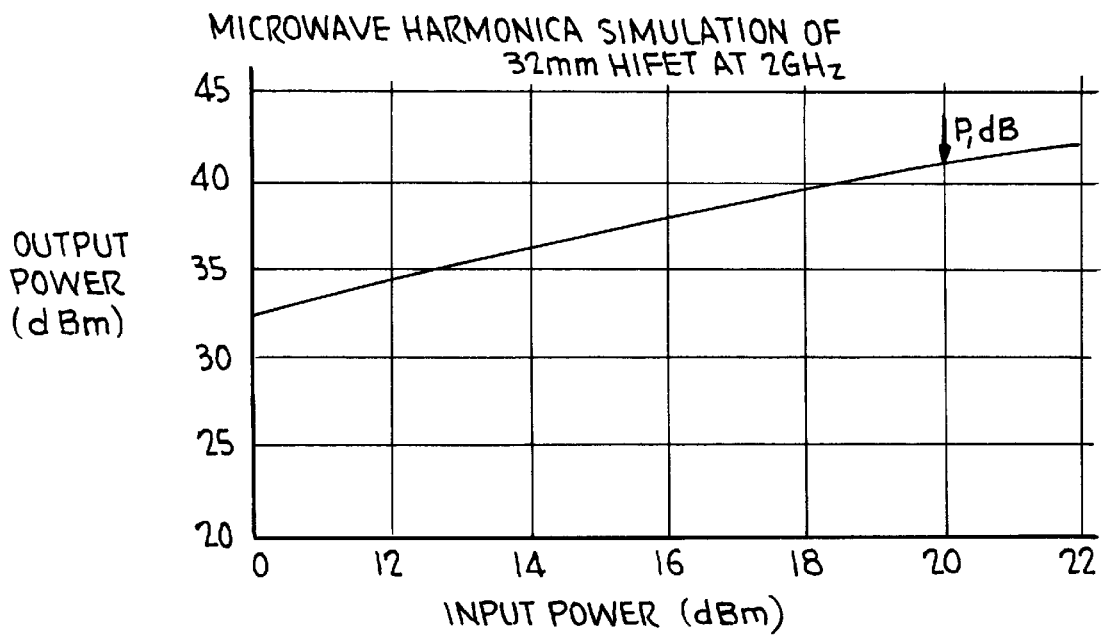
FIG. 4 shows simulated results of operation of the circuit of FIG. 3.

FIG. 4 shows a simulation of the nonlinear power performance of the HiVP circuit of the invention, implemented as indicated in FIG. 3, at 2 GHz. The output impedance is assumed to be 30 $\Omega$, otherwise no matching circuits were added to the device. Notice that the power at 1 dB compression is 41 dBm which is close to 12.5 W. This power level translates to a power density of 0.39 W/mm.

The same power density can be achieved using the conventional design of FIG. 1, but at lower power outputs, and with greater design complexity and cost.

As mentioned above, FIG. 5 shows a second "low-voltage high-power (LoVHiP)" embodiment of the amplifier circuit of the invention, preferred where only a limited voltage is available for bias supply, e.g., where a portable device, such a cordless or cellular telephone, must be powered by a battery. In this embodiment, the RF signal path is essentially as in that of FIG. 2.

The input signal is supplied at an input terminal 52, and passes through an input matching network 54 to the gate terminal G of a first transistor FET1 of a string of four (in this implementation) series-connected FETs. The output signal from the drain of the last transistor FET4 in the series passes through an output matching network 56 to an output terminal 58. The output signal is again also fed back to the gates G of each of the transistors FET1–FET4 through a string of series-connected resistors R2–R5.

Capacitors C1–C3 again provide impedance adjustment for each of the amplifier cells comprising FETs 2–4.

Figure 5:
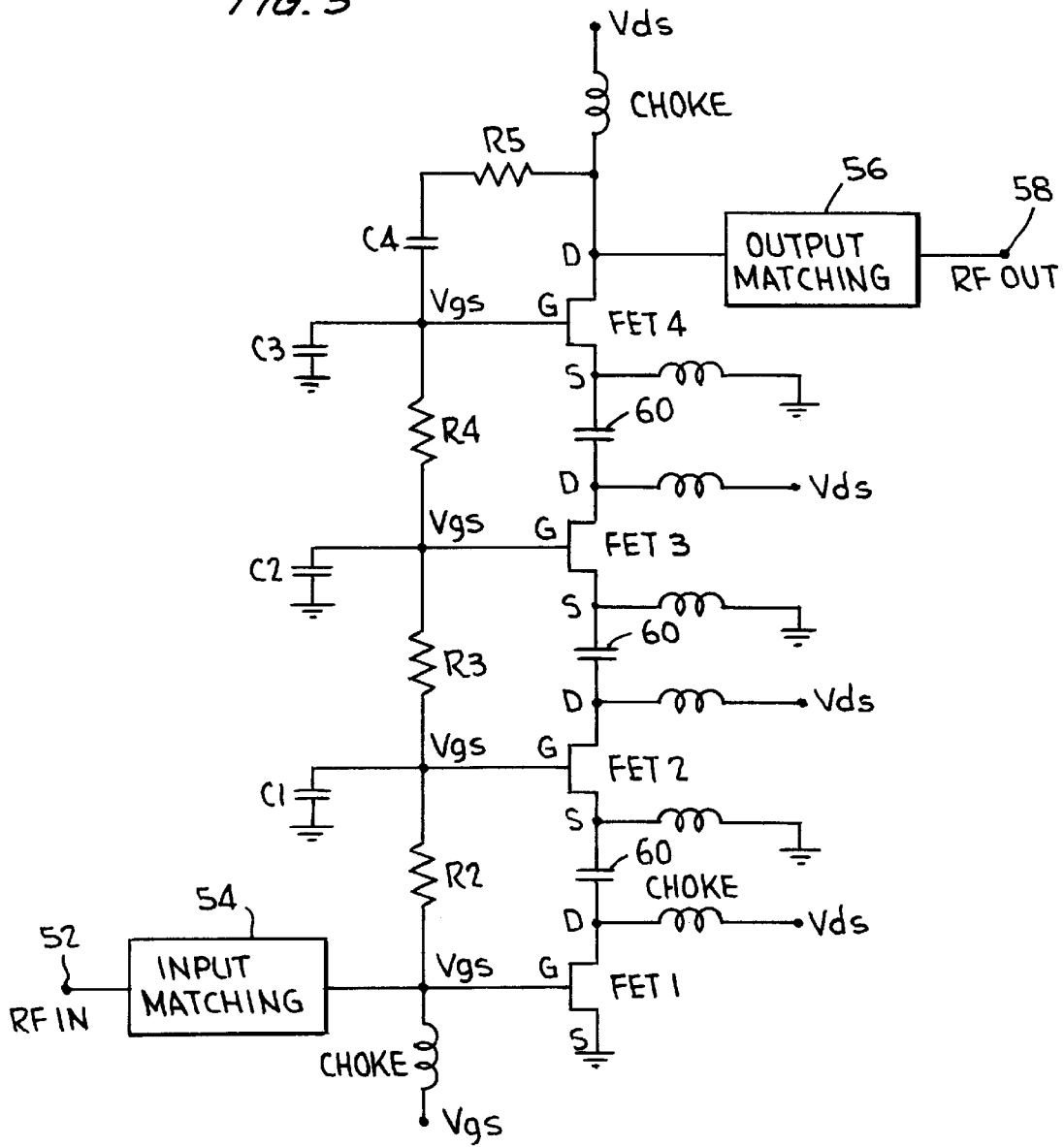
FIG. 5 shows a block diagram of a second low voltage embodiment of the amplifier of the invention.

The main difference between the high-voltage implementation of the invention shown in FIG. 2 and the low-voltage implementation of FIG. 5 is in the provision of bias voltage to each amplifier cell.

As discussed in detail above, in the FIG. 2 embodiment, a relatively high supply voltage $V_{dd}$ is divided by resistors R2–R5 to values suitable for supply to each of the cells. In the FIG. 5 embodiment, this high voltage $V_{dd}$ is not available. Hence a lower supply voltage, directly suitable as the drain-to-source voltage $V_{ds}$, is supplied directly to each of the cells.

Thus, as indicated in FIG. 5, each of the four cells shown is provided with parallel, separate connections to $V_{ds}$ and to ground. Capacitors, 60 prevent flow of DC bias voltage between the adjoining transistors, while permitting flow of RF energy, as required for series amplification according to the invention. The bias supply is thus effected as a parallel connection, as compared to the series connection of the high-voltage embodiment of FIG. 2. A choke is provided between the corresponding terminals of the FETs 1–4 and the source of $V_{ds}$ and ground, except for the ground connection of the first transistor FET1; the chokes prevent loss of the RF signal energy. More particularly, provision of the chokes and capacitors 60 as shown allows the RF signal to pass for amplification along the string of series-connected transistors FET1–FET 4, while allowing separate, parallel supply of bias voltage $V_{ds}$ to each cell.

Thus, it will be appreciated that in the prior art circuit of FIG. 1, the RF signal was divided, amplified in parallel, and recombined, while the DC bias was provided to the amplifying transistors in series. In both embodiments of the invention, the amplification takes place in series; in the high-voltage embodiment of FIG. 2, the bias voltage is also provided in series, while in the low-voltage embodiment of FIG. 5, the bias voltage is provided in parallel.

While the detailed design of one implementation of the circuit of FIG. 2 provided in FIG. 3 and discussed in detail above employs GaAs MESFETs as FETs 1–4, it will be appreciated that other types of amplifying elements, such as GaAs HEMT, PHEMT and HBT devices, as well a, silicon bipolar or MOSFET transistors, could replace the FETs of FIG. 2. In each case the input signal is applied to a control terminal of each element, e.g., the gate terminals G of FETs 1–4; amplification is effected by control of bias current flowing between input and output terminals of each, e.g., the source and drain terminals S and D respectively, of FETs 1–4. Modification of the circuits shown herein as required to accomodate such alternative amplifying elements is well within the skill of the art, as is implementation of the low-voltage circuit of FIG. 5. Similarly, the principles shown are applicable to circuits having fewer or more amplifying elements; various other modifications will also be apparent to those of skill in the art.

The HiVP device according to the invention can be used in MIC hybrid designs or in MMIC designs to achieve high power and broadband performance not achievable by conventional designs. Moreover, a very straightforward implementation of the HiVP circuit using existing silicon devices will provide very high power levels.

Therefore, while several preferred embodiments of the invention have been discussed in detail, it will be appreci-

What is claimed is:

1. An amplifier for amplifying an input signal, comprising:
 a plurality of semiconductor amplifying elements, each comprising a control terminal to which a signal may be applied for controlling the flow of current between additional input and output terminals, and a source of bias voltage providing power for said amplifying elements,
 said plurality of amplifying elements being connected in series, such that the output terminal of a first element of the series is connected to the input terminal of the next element of the series, and so on, the input signal being applied to the control terminal of the first element of the series, and the output terminal of the last element of the series being connected to an output circuit, and the output terminal of the last element of the series also being connected to the control terminals of each of the elements of the series, such that the output signal from the last element of the series is supplied to the control terminals of each of the elements of the series for feedback,
 wherein capacitors are connected between the control terminals of each of the amplifying elements in the series except the first and ground, the value of each said capacitor being chosen to optimize the impedance of and power output by the corresponding amplifying elements;
 wherein said source of bias voltage is connected to the output terminal of the last of said elements in said series through a choke, and wherein said bias voltage is provided to each of said elements by voltage-dividing resistors in series across the control terminals of said elements; and
 wherein said output signal is supplied to the control terminals of each of the elements of the series for feedback through the same series-connected resistors used to supply bias voltage.

2. The amplifier of claim 1, wherein the control terminal of the first of said amplifying elements of the series is connected to a point maintained at a fixed potential through a choke, such that high-frequency input signal components are not grounded.

3. The amplifier of claim 1, further comprising an input matching network between the input terminal of said amplifier and the control terminal of the first amplifying element in said series, and an output matching network between the output terminal of the last amplifying element in the series and the output terminal of said amplifier.

4. The amplifier of claim 3, wherein said input and output matching networks comprise capacitors.

5. The amplifier of claim 1, wherein additional bias voltage is supplied separately to each of said amplifying elements.

6. The amplifier of claim 5, wherein the additional bias voltage is applied separately across the input and output terminals of each of said amplifying elements, and a choke is provided between at least the output terminal of each and the source of bias voltage.

7. The amplifier of claim 6, wherein a choke is also provided between the input terminals of all but the first of said amplifying elements in said series and ground.

8. The amplifier of claim 6, wherein capacitors are connected between the output and input terminals of adjoining elements of said series.

9. The amplifier of claim 6, wherein said output signal is supplied to the control terminals of each of the elements of the series for feedback through a string of series-connected resistors.

10. The amplifier of claim 1, wherein the value $C_{shunt}$ of each of said capacitors connected between the control terminals of each of the amplifying elements in the series except the first and ground is chosen so as to optimize the impedance $Z_{source}$ of the corresponding amplifying element, in accordance with the following equation:

$$Z_{source} \approx 1/g_m * (C_{gs} + C_{shunt})/C_{shunt}$$

where
 $Z_{source}$ is the impedance of the corresponding amplifying element;
 $g_m$ is the cell transconductance of the corresponding amplifying element;
 $C_{gs}$ is the gate to source cell capacitance; and
 $C_{shunt}$ is the value of the capacitance between the control terminal and ground.

11. A circuit for providing high-power, high-impedance amplification of a RF signal, comprising:
 a plurality of amplifying elements, each comprising input, output, and control terminals,
 said plurality of amplifying elements being connected in series, such that the output terminal of the first element in the series is connected to the input terminal of the second, and so on;
 an input connection for applying a RF input signal to the control terminal of the first element in the series;
 an output connection connected to the output terminal of the last element in the series, for applying an amplified RF output signal to a load;
 a source of bias voltage operatively connected to each of said amplifying elements;
 a feedback path for supplying a portion of the output signal to the control terminals of each of the elements in the series;
 capacitors connected between the control terminals of each of the amplifying elements in the series except the first and ground, the value of each said capacitor being chosen to optimize the impedance of and power output by the corresponding amplifying element;
 wherein said bias voltage is provided to each of said elements by voltage-dividing resistors in series across the control terminals of said elements; and
 wherein said output signal is supplied to the control terminals of each of the elements of the series for feedback through the same series-connected resistors used to supply bias voltage.

12. The circuit of claim 11, wherein said source of bias voltage is connected to the output terminal of the last of said elements in said series through a choke.

13. The circuit of claim 11, further comprising an input matching network between said input connection and the control terminal of the first amplifying element in said series, and an output matching network between the output terminal of the last amplifying element in the series and said output connection.

14. The circuit of claim 13, wherein said input and output matching networks comprise capacitors.

15. The circuit of claim 11, wherein additional bias voltage is supplied separately to each of said amplifying elements.

16. The circuit of claim 15, wherein the additional bias voltage is applied separately across the input and output terminals of each of said amplifying elements, and a choke is provided between at least the output terminal of each and the source of bias voltage.

17. The circuit of claim 16, wherein capacitors are connected between the output and input terminals of adjacent elements in said series.

18. The circuit of claim 16, wherein a choke is also provided between the input terminals of all but the first of said amplifying elements in said series and ground.

19. The circuit of claim 15, wherein said output signal is supplied to the control terminals of each of the elements of the series for feedback through a set of series-connected resistors.

20. The circuit of claim 11, wherein the value $C_{shunt}$ of each of said capacitors connected between the control terminals of each of the amplifying elements in the series except the first and ground is chosen so as to optimize the impedance $Z_{source}$ of the corresponding amplifying element, in accordance with the following equation:

$$Z_{source} \cong 1/g_m * (C_{gs} + C_{shunt})/C_{shunt}$$

where $Z_{source}$ is the impedance of the corresponding amplifying element;

$g_m$ is the cell transconductance of the corresponding amplifying element;

$C_{gs}$ is the gate to source cell capacitance; and $C_{shunt}$ is the value of the capacitance between the control terminal and ground.

21. A method for providing high-power, high-impedance amplification of an RF input signal, comprising the steps of:

connecting a plurality of amplifying elements, each comprising input, output, and control terminals, in series, such that the output terminal of the first element in the series is connected to the input terminal of the second, and so on;

applying an RF input signal to the control terminal of the first element in the series;

providing bias voltage to each of said amplifying elements, such that the input RP signal is amplified in each element;

connecting a load to the output terminal of the last element in the series, for applying an amplified RF output signal to the load;

feeding back a portion of the output signal to the control terminals of each of the elements in the series; and wherein capacitors are connected between the control terminals of each of said amplifying elements, except the first, and ground, the value of each of said capacitors being chosen to adjust the impedance of and power output by the corresponding amplifying element;

wherein said step of providing bias voltage to each of said amplifying elements is performed by providing a voltage $V_{dd}$ greater than the desired bias voltage $V_{ds}$, and dividing $V_{dd}$ into smaller voltages employing a plurality of series-connected resistors; and wherein said plurality of series-connected resistors are connected across the control terminals of said amplifying elements, and wherein said portion of the output signal is also fed back thereby to the control terminals of said amplifying elements.

22. The method of claim 21, comprising the further step of providing additional bias voltage to each of said amplifying elements by supplying a desired bias voltage $V_{ds}$ separately to each of said amplifying elements.

23. The method of claim 22, wherein a source of said desired bias voltage $V_{ds}$ is connected to the output terminal of each of said amplifying elements through a choke.

24. The method of claim 23, wherein the input terminal of each amplifying elements except the first is connected through a choke to ground.

25. The method of claim 22, wherein capacitors are connected between he output and input terminals of adjoining ones of said amplifying elements.

26. The method of claim 21, wherein the value $C_{shunt}$ of each of said capacitors connected between the control terminals of each of the amplifying elements in the series except the first and ground is chosen so as to optimize the impedance $Z_{source}$ of the corresponding amplifying element, in accordance with the following equation:

$$Z_{source} \cong 1/g_m * (C_{gs} + C_{shunt})/C_{shunt}$$

where $Z_{source}$ is the impedance of the corresponding amplifying element;

$g_m$ is the cell transconductance of the corresponding amplifying element;

$C_{gs}$ is the gate to source cell capacitance; and $C_{shunt}$ is the value of the capacitance between the control terminal and ground.

* * * * *